United States Patent
Itkin

(10) Patent No.: US 10,938,425 B2
(45) Date of Patent: Mar. 2, 2021

(54) CONTROL CIRCUIT AND APPARATUS, RADIO FREQUENCY CIRCUIT AND APPARATUS, TRANSCEIVER, MOBILE TERMINAL, METHODS AND COMPUTER PROGRAMS FOR DETERMINING CALIBRATION VALUES FOR A RADIO FREQUENCY CIRCUIT

(71) Applicant: Intel IP Corporation, Santa Clara, CA (US)

(72) Inventor: Grigory Itkin, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/348,199

(22) PCT Filed: Nov. 9, 2017

(86) PCT No.: PCT/US2017/060751
§ 371 (c)(1),
(2) Date: May 8, 2019

(87) PCT Pub. No.: WO2018/111454
PCT Pub. Date: Jun. 21, 2018

(65) Prior Publication Data
US 2019/0334565 A1    Oct. 31, 2019

(30) Foreign Application Priority Data
Dec. 16, 2016  (EP) ..................... 16204757

(51) Int. Cl.
*H04B 1/04*       (2006.01)
*H04B 17/12*      (2015.01)

(52) U.S. Cl.
CPC ............. *H04B 1/0458* (2013.01); *H04B 1/04* (2013.01); *H04B 17/12* (2015.01); *H04B 2001/0433* (2013.01)

(58) Field of Classification Search
CPC ........ H04B 1/0458; H04B 1/04; H04B 17/12; H04B 2001/0433
(Continued)

(56) References Cited
U.S. PATENT DOCUMENTS

2009/0253385 A1* 10/2009 Dent .................... H04B 1/0458
                                                          455/83
2010/0073103 A1*  3/2010 Spears ...................... H03H 7/40
                                                          333/17.3
(Continued)

FOREIGN PATENT DOCUMENTS

EP       2489123 A1     8/2012
WO    2009124874 A1    10/2009

*Primary Examiner* — Kevin M Burd
(74) *Attorney, Agent, or Firm* — 2SPL Patent Attorneys PartG mbB; Kieran O'Leary

(57) ABSTRACT

Examples provide a control circuit and a control apparatus, a radio frequency circuit and a radio frequency apparatus, a transceiver, a mobile terminal, methods and computer programs for determining calibration values for a radio frequency circuit. A control circuit (10) is configured to determine calibration values for a radio frequency circuit (100) with a transmit unit (102) coupled to an antenna (104) through an antenna tuner (106). The control circuit (10) is configured to determine the calibration values for the radio frequency circuit (100) based on at least two impedance measurements and based on at least two antenna tuner configurations.

18 Claims, 10 Drawing Sheets

(58) Field of Classification Search
USPC .......................................................... 375/297
See application file for complete search history.

(56) References Cited

U.S. PATENT DOCUMENTS

| | | |
|---|---|---|
| 2011/0039504 A1 | 2/2011 | Nguyen et al. |
| 2012/0112852 A1 | 5/2012 | Manssen et al. |
| 2012/0249259 A1 | 10/2012 | Keese et al. |
| 2013/0309980 A1 | 11/2013 | Seth |
| 2014/0210686 A1 | 7/2014 | Ali et al. |
| 2015/0138026 A1 | 5/2015 | Shay |
| 2015/0333781 A1* | 11/2015 | Alon .................. H03F 3/21 370/277 |
| 2015/0364822 A1 | 12/2015 | O'Driscoll |
| 2016/0126618 A1* | 5/2016 | Strange ................ H01Q 21/50 343/861 |

* cited by examiner

FIG.8
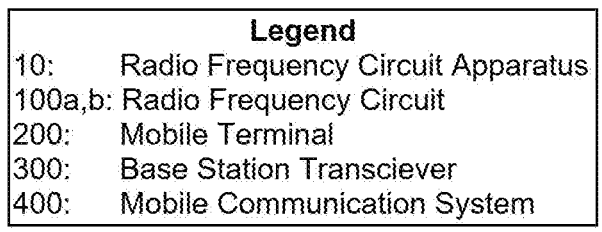
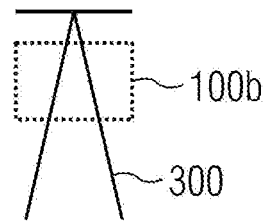
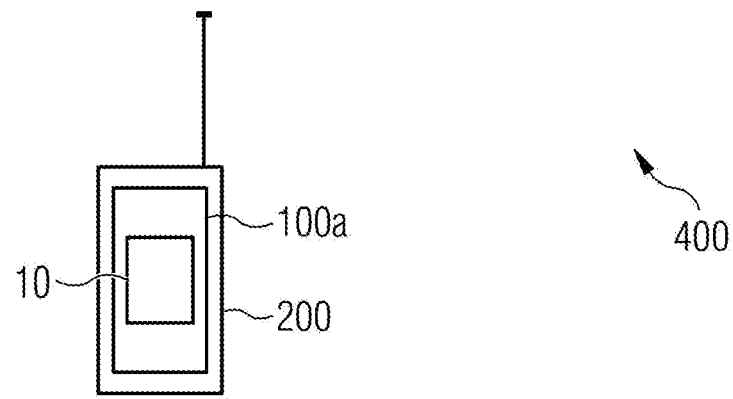
FIG. 9
Determining calibration values based on at least two impedance measurements and at least two antenna tuner configurations

CONTROL CIRCUIT AND APPARATUS, RADIO FREQUENCY CIRCUIT AND APPARATUS, TRANSCEIVER, MOBILE TERMINAL, METHODS AND COMPUTER PROGRAMS FOR DETERMINING CALIBRATION VALUES FOR A RADIO FREQUENCY CIRCUIT

FIELD

Examples relate to a control circuit and a control apparatus, a radio frequency circuit and a radio frequency apparatus, a transceiver, a mobile terminal, methods and computer programs for determining calibration values for a radio frequency circuit, and in particular, but not exclusively, to a concept and mechanism for calibrating a radio frequency circuit.

BACKGROUND

With the growing demand for wireless services, Radio Frequency (RF) circuits become more and more versatile. For example, the number of wireless access technologies and the frequency range in which mobile communication systems are active are growing, wherein a physical size and power consumption of RF units is decreasing. For example, $5^{th}$ Generation (5G) system may operate using mm-wave technology, e.g. the U.S. Federal Communications Commission (FCC) approved spectrum for 5G, including the 28, 37, and 39 GHz bands.

RF circuit components such as filters, amplifiers, antennas, diplexers, duplexers, etc. are designed for such high frequency and broad bandwidth applications. Impedance mismatches, for example, of an output impedance of a power amplifier and an input impedance of an antenna may be improved by using antenna tuners. Measurements of current antenna impedances are an important issue for high-end mobile communication devices. Mismatched antennas may reflect significant parts of transmit (TX) power back to a Power Amplifier (PA) increasing nonlinear distortions, total mobile heating, battery consumption and could result in performance degradation, call drops or even PA damage.

Measurements of actual antenna impedances can help avoiding said problems using, for example, PA Direct Current (DC) settings, bias variations, or in some cases antenna tuners.

BRIEF DESCRIPTION OF THE FIGURES

Some examples of apparatuses, methods and/or computer programs will be described in the following by way of example only, and with reference to the accompanying figures, in which

FIG. 8 shows examples of a mobile terminal, a base station transceiver and a mobile communication system;

FIG. 9 depicts a block diagram of an example of a method for determining calibration values.

DETAILED DESCRIPTION

Figure 1:
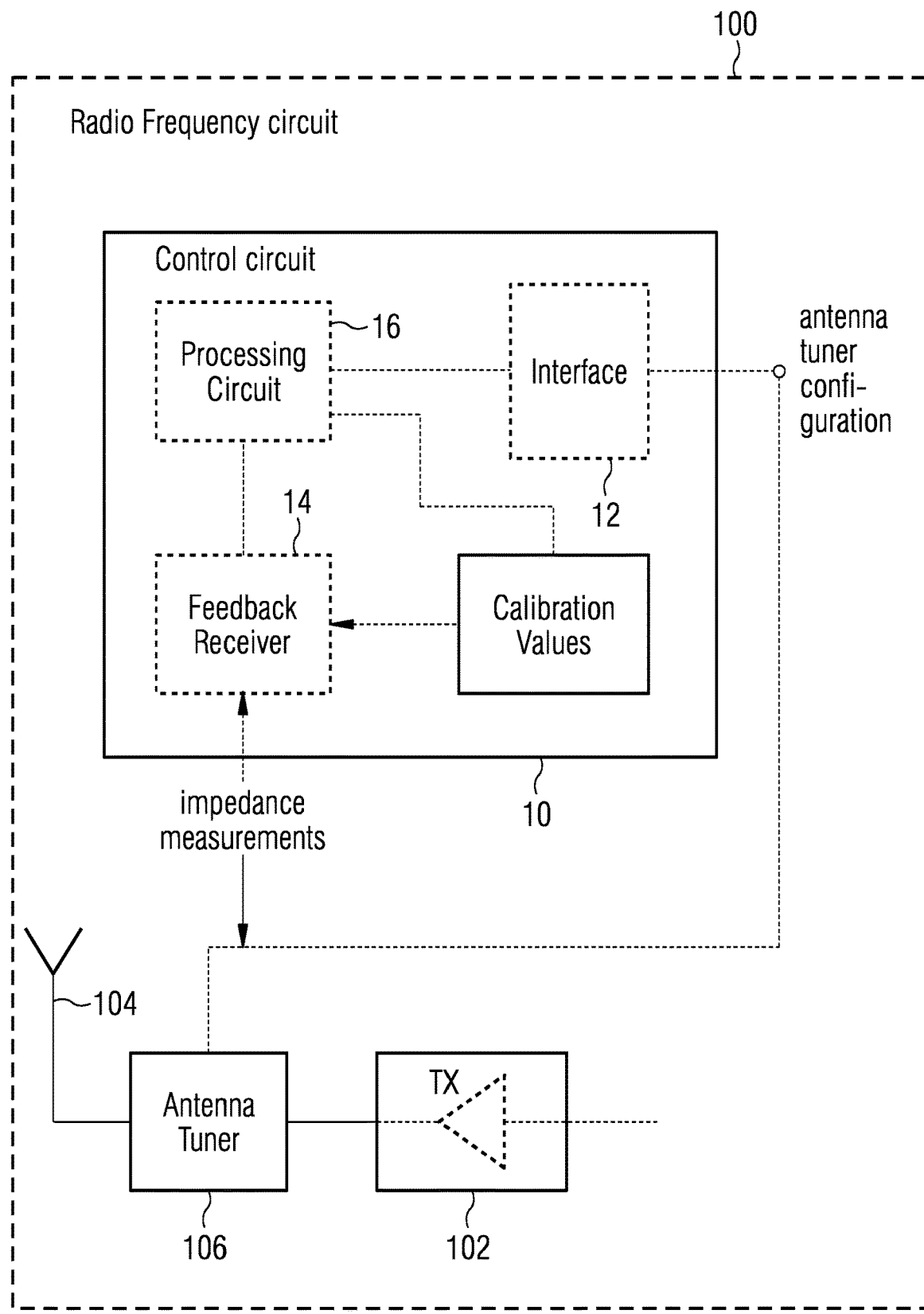
FIG. 1 illustrates an example of a control circuit and an example of a radio frequency circuit.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Examples are based on the finding that calibration efforts, e.g. calibration for all conceivable transmission bands, during manufacturing can be time and cost intensive. Examples are further based on the finding that multiple (at least two) impedance measurements, which can be carried out for different antenna tuner settings, may be used to determine calibration values for impedance measurement equipment, e.g. a feedback receiver in a transmitter unit. Based on the known antenna tuner settings (scattering parameters of the corresponding Scattering-matrix (S-matrix), e.g. reflection factors, gain, attenuations, return loss, standing wave ratio, etc.) and the measurements, calibration values can be determined for the impedance measurement equipment.

FIG. 1 illustrates an example of a control circuit 10 and an example of a radio frequency circuit 100, where optional components are indicated by dashed lines in the FIGS. The control circuit 10 is configured to determine calibration values for the radio frequency circuit 100 with a transmit unit 102 coupled to an antenna 104 through an antenna tuner 106. The control circuit 10 is configured to determine the calibration values for the radio frequency circuit 100 based on at least two impedance measurements and based on at least two antenna tuner configurations. The control unit 10 may correspond to one or more elements of the group of a control unit, a control device, a control module, means for controlling, a control apparatus, a processor, a microcontroller, a Digital Signal Processor (DSP), a Radio Frequency (RF) micro controller or processor, etc.

The radio frequency circuit 100 may be any circuit, Printed Circuit Board (PCB), chip, substrate, structure configured to transmit and/or receive radio signals. The radio frequency circuit 100 may comprise one or more typical radio RF processing components, for example, a transmit and/or receive unit, an antenna tuner, a filter, a diplexer, a duplexer, an antenna, a PA, a Low Noise Amplifier, RF-wiring, a mixer, a Digital-Analog converter (DA), an Analog-Digital converter (AD), etc. The transmit unit 102 may correspond to any transmitter, a transmit device, a transmit module, means for transmitting, PA, etc. The antenna 104 may correspond to any antenna, e.g. one or more elements of the group of a dipole antenna, a horn antenna, a fractal antenna, a magnetic antenna, an antenna field, antenna array, a patch antenna, a mobile terminal antenna, a base station antenna, etc. The antenna tuner 106 may correspond to any matching or adaption circuit, means for antenna tuning, or component, which is configured to match impedances of a transmit unit and an antenna feedline, the combination of antenna feedline and antenna, respectively. Typically, a number of configurations can be selected or tuned to in order to achieve such matching. The antenna tuner 106 may assume the role of a matching network or matchbox, however, can be controlled, e.g. by the above control circuit 10.

FIG. 1 also illustrates an example of a control apparatus 10, in line with the control circuit 10, configured to determine calibration values for a radio frequency apparatus 100 with means 102 for transmitting coupled to an antenna 104 through means 106 for antenna tuning. The control apparatus 10 is configured to determine the calibration values for the radio frequency apparatus 100 based on at least two impedance measurements and based on at least two antenna tuner configurations.

As further shown in FIG. 1, in some examples the control circuit 10 may comprise an interface 12 configured to set different antenna tuner configurations at the antenna tuner 106. The interface 12 may correspond to any means 12 for setting different antenna tuner configurations at the means 106 for antenna tuning, e.g. any connector, contact, pin etc. which allows setting the configuration using according indicators, e.g. an analog or a digital signal indicative of an antenna tuner 106 setting. The control circuit 10, the control apparatus 10, respectively, may comprise a feedback receiver 14 configured to carry out impedance measurements between the transmit unit 102 and the antenna 104. The feedback receiver 14 may correspond to means 14 for receiving feedback being configured to carry out impedance measurements between the means 102 for transmitting and the antenna 104. The feedback receiver 14 may correspond to any component capable of measuring an impedance between the transmit unit 102 and the antenna 104. For example, a coupler may be used to determine signals indicative of strengths and phases of waves travelling towards the antenna and travelling away from the antenna (reflected waves).

The control circuit 10, the control apparatus 10, respectively, may comprise a processing circuit 16 coupled to the interface 12 and the feedback receiver 14. The processing circuit 16 may correspond to any means for processing, any processor, controller, microcontroller, RF-controller, etc. The processing circuit 16 (means for processing) may be configured to obtain the at least two subsequent impedance measurements using the feedback receiver based on the at least two different antenna tuner configurations, and to determine the calibration values based on the impedance measurements and the antenna tuner configurations.

Figure 2:
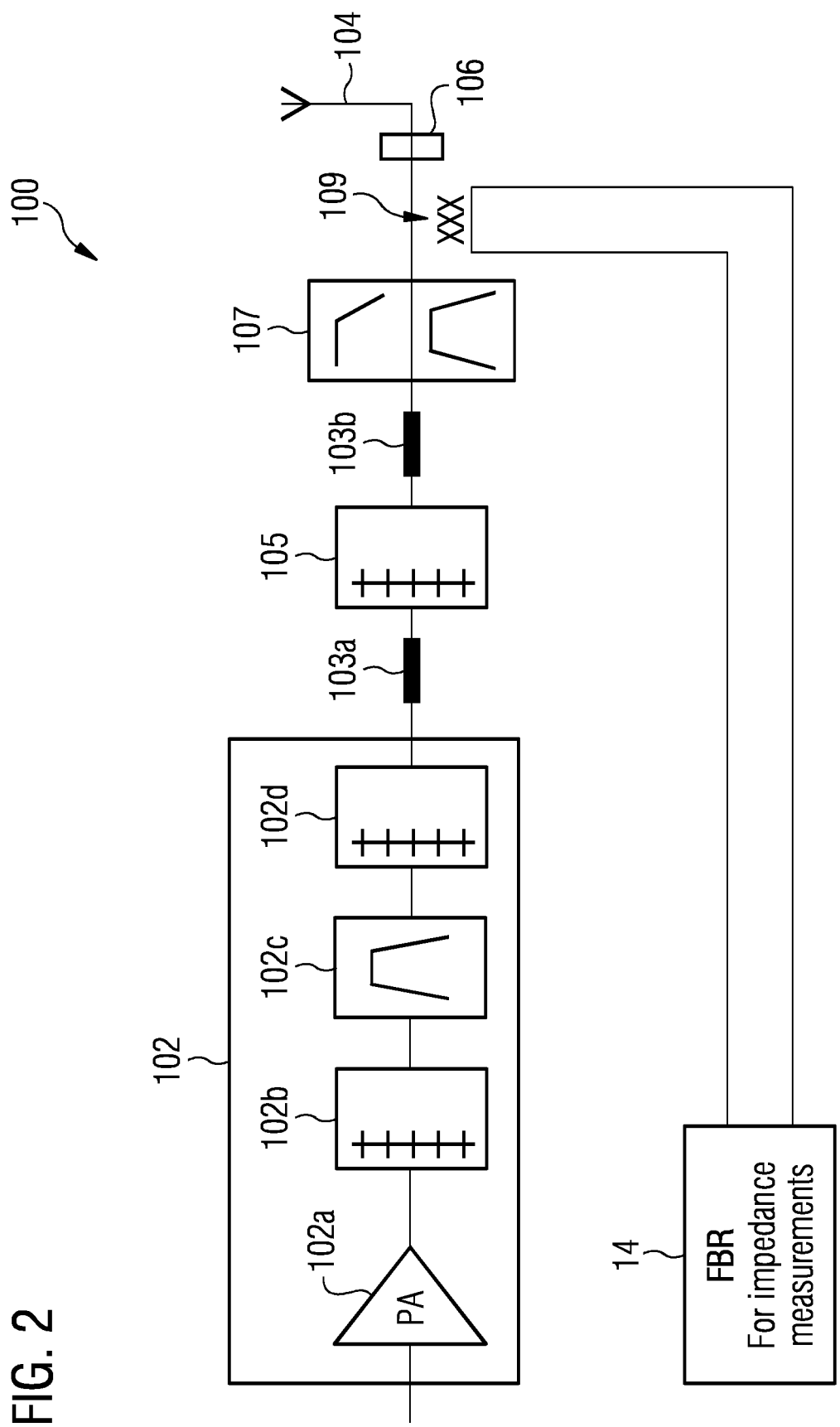
FIG. 2 shows a radio frequency front end with a feedback receiver for impedance measurements.

In some examples antenna impedance measurements are carried out using a TX chain as signal source, e.g. utilizing a directional coupler to capture forward and reverse waves to a Feed Back Receiver 14 (FBR), which converts signals down to DC and delivers averaged values to the processing circuit 16, e.g. a DSP, to calculate a gamma value (relation between values indicative of reverse and forward waves). Impedance measurement theory is based on the fact that a signal source during measurement has a stable source impedance of 50 Ohms and a directional coupler is ideal without any parasitic effects. In practical implementations this may not be the case. Several measurement problems may occur. For example, FIG. 2 shows a radio frequency front end with a feedback receiver 14 for impedance measurements as it may be used in an example. The RF front end may at least partly comprise components as used in an example of the RF circuit or apparatus 10 as shown in FIG. 1. The transmit unit 102 of the RF front end shown in FIG. 2 comprises a PA 102a, switches 102b, 102d (multiplexers with filter banks), and a bandpass filter 102c, which are used to select and filter a desired frequency band or carrier to be transmitted. Feeding lines 103a and 103b are used to connect an output of the transmit unit 102 to another switch 105 and a subsequent diplexer/duplexer 107. A coupler 109 couples a part of the signals traveling to and from the input of the antenna tuner 106 to the FBR 14.

As can be seen in FIG. 2 there are several passive frequency dependent elements between PA 102a (signal source) and directional coupler 109 (measurement reference plain) like switches 102b, 102d, 105, Duplexers, Diplexers 107 etc. In addition to frequency dependent source impedance there may be another problem during measurements due to so-called cross talk (X-talk) inside of the directional coupler 109. X-talk can be considered as another contributor to measurement deviations in a non-calibrated case. Said problem can shift measurement impedance value because a part of the reflected wave's energy reaches the FBR 14 during measurement of a forward wave and vice versa. Further, measurement distortions may be expected if the antenna 104 is connected to the directional coupler 109 through a long cable and/or if there are several passive components like Electro Static Discharge (ESD) protection inductors or Direct Current (DC) decoupling serial capacitors between the antenna 104 and the directional coupler 109.

Figure 3:
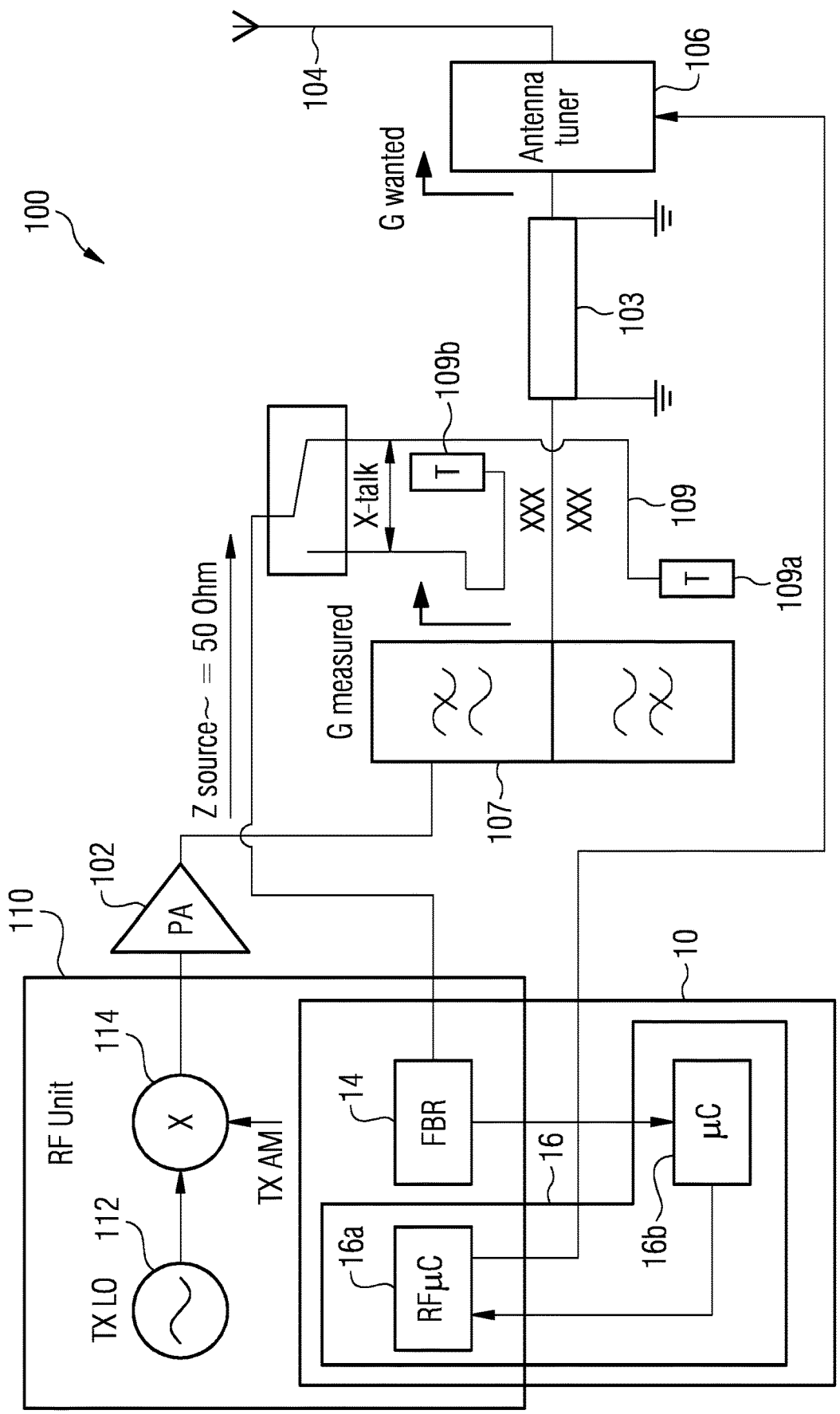
FIG. 3 depicts a block diagram of a radio frequency circuit indicating sources of impedance measurement distortions.

FIG. 3 depicts a block diagram of an example of a radio frequency circuit 100 or apparatus 100 indicating sources of impedance measurement distortions. The RF circuit 100 comprises an RF unit 110, which is configured to generate an RF signal. The RF unit 110 comprises a Local Oscillator (LO) 112 for providing a mixer/AM modulator 114 (Amplitude Modulation) with a mixing/output frequency. In the present example, a TX AM signal controlling the magnitude of output signals of the mixer/AM modulator 114 is based on an input information signal from the input signal source (not shown) after its conversion into a polar coordinate system. The output of the RF unit 110 is then input into the transmit unit 102, represented by a PA. The FBR 14 is controlled by the processing circuit 16, which is implemented in the present example as an RF-microcontroller 16a and a microcontroller 16b. The control circuit 10 in this example hence comprises the RF controller 16a and the controller 16b as processing circuit 16 and a FBR 14. The FBR 14 is configured to provide information indicative on impedance measurement results to the controller 16b.

The example of the RF circuit 100 shown in FIG. 3 further comprises a diplexer/duplexer 107 coupled to the output of the transmit unit 102. The output of the diplexer/duplexer 107 is then provided to an antenna tuner 106 through feedline 103. The antenna tuner 106 is coupled to transmit antenna 104. The FBR 14 is coupled to a directional coupler 109, which is galvanically coupled to the transmit path between the diplexer/duplexer 107 and the feedline 103. The coupler 109 comprises terminating resistors 109a and 109b. Generally, to create correct measurements calibration of every single transmitter over all desired frequencies may be necessary. Application of post processing correction after every single measurement can be carried out.

Figure 4:
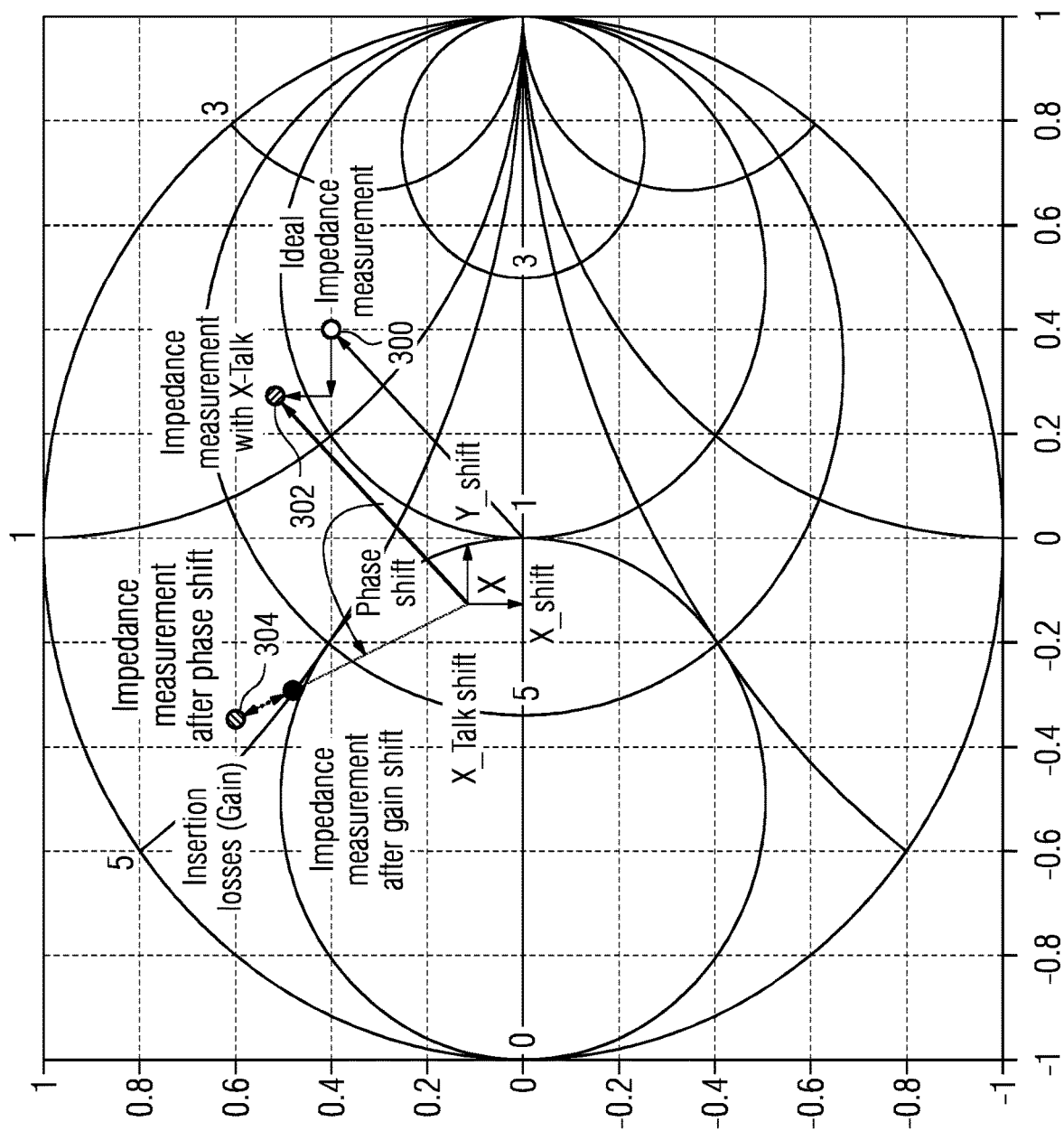
FIG. 4 illustrates components of impedance measurement distortions in a Smith chart.

FIG. 4 illustrates components of impedance measurement distortions in a Smith chart diagram. In the following some examples will be detailed using Smith chart representations. As known in the art a Smith chart is a view chart potentially displaying multiple parameters including impedances, admittances, reflection coefficients, scattering parameters, noise figures, etc. The Smith chart is mathematically a conform mapping of the Cartesian plane onto a unit circle, where the scaling can be normalized, e.g. to 50 Ohm, which is a typical value but any other value could as well be used.

FIG. 4 illustrates how different distortion components (components of impedance measurement distortions) shift or distort impedance measurement results. On first stage ideal impedance 300 presented as gamma vector on the Smith chart is moved linearly by X-talk shift values, which are indicated linear offsets, X_shift, Y_shift in the Smith chart, resulting in an impedance measurement 302 with X-talk. Then the gamma vector is rotated in phase resulting in an impedance measurement 304 after phase shift because of feedline 103. The magnitude of the impedance measurement 304 is reduced because of feed line(s) insertion losses, passive matching components and/or other PCB elements and lines resulting in an impedance measurement 306 after gain shift. To restore original ideal measurement value 300, four correction components are found in some examples. These four components are Gain, Phase Shift, and X-talk (X+Y). In examples, the calibration values may comprise at least one element of the group of a correction value for a crosstalk of a coupler of the feedback receiver, a correction value for phases of the impedance measurements and a correction value for magnitudes of the impedance measurements.

Factory calibration of impedance measurements is time consuming and may require several high precision components like defined loads, which are expensive. As already introduced above, the RF circuit 100 in modern communication systems may comprise antenna tuners 106 to compensate antenna mismatch. In such an example an antenna tuner 106 could be used as a part of self-learning systems allowing online impedance measurement calibration without using any factory equipment.

Examples may provide components and methods for online calibration using at least one of the following steps. The antenna tuner 106 is known in advance in terms of its S-Matrix measured for different configurations over frequencies to be used. The antenna tuner configurations may be based on known frequency dependent S-matrices of the antenna tuner 106. For every required frequency several (at least two) impedance measurements may be carried out during normal operations just after each other using different (predefined) antenna tuner configurations. For example, the measurements may be carried out in subsequent radio frames or slots, for example, the time between two measurements may be 1 ms, 2 ms, 3 ms, 5 ms, 10 ms, 15 ms, 20 ms, etc.

A load impedance from the antenna 104 could be any possible, but is assumed to be constant (basically not changing significantly, e.g. less than 10%, 5%, 3%, 2%, 1%, etc.) during measurements time or for the at least two subsequent measurements. The measurements could, for example, be carried out within a load coherence time. The measured impedance values and the known S-matrixes of the antenna tuner 106 for used configurations are sent to the processing circuit 16, e.g. a Central Processing Unit (CPU), for calculation to find correction values, in some embodiments even the best possible correction values. The found correction values may then be used for all coming impedance measurements for as long as the TX frequency is constant.

Figure 5:
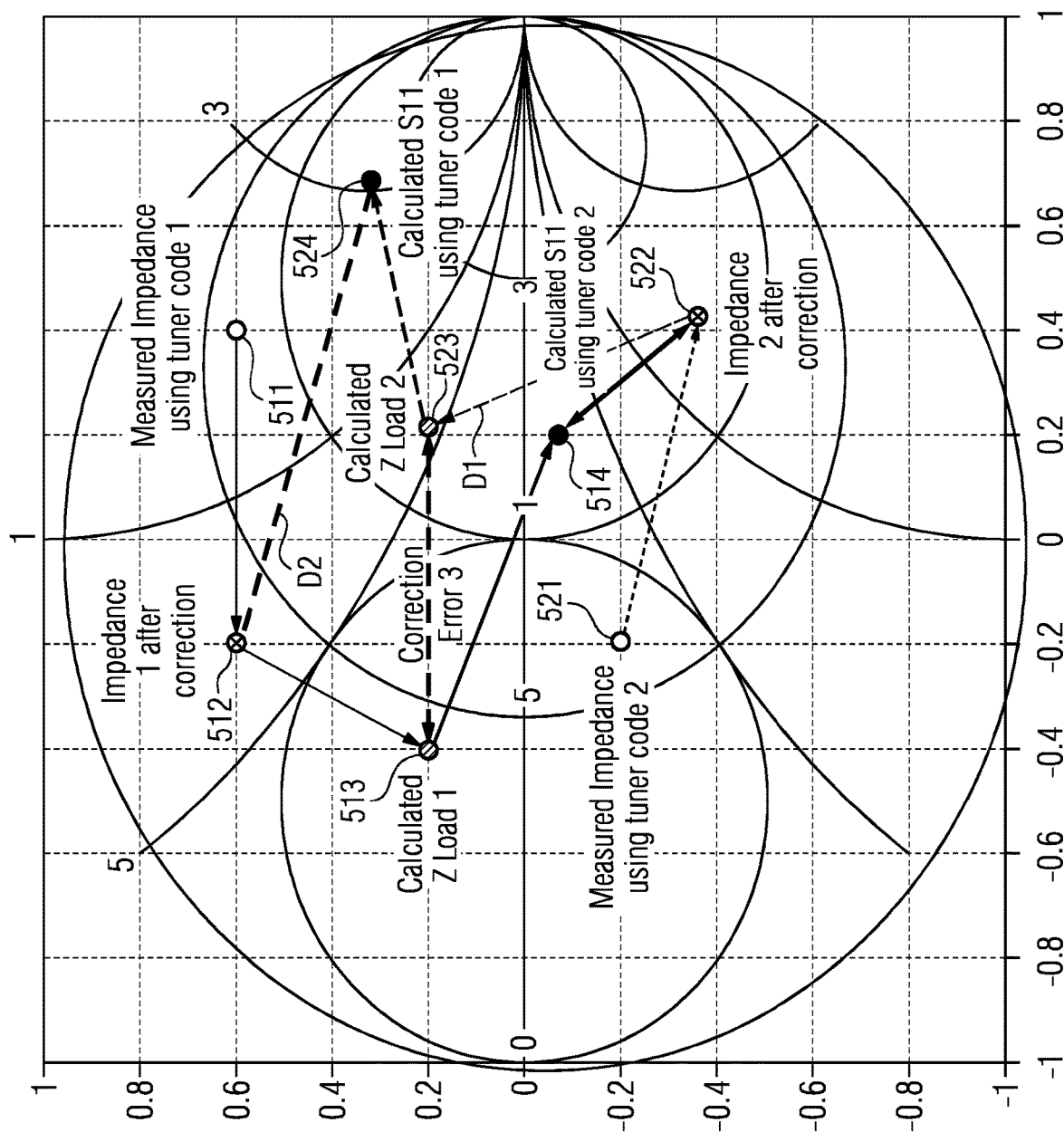
FIG. 5 shows calibration value determination in an example using a Smith chart.

Examples may find correction values online without factory calibration. For example, at least two impedance measurements are done using different antenna tuner configurations shortly after each other to guarantee constant antenna load. At least some example use a software implemented method applied to the measured values. Some examples may calculate new impedances as will be further detailed using FIG. 5. FIG. 5 shows calibration value determination in an example using a Smith chart. FIG. 5 shows an illustration of an example of a calculation method.

An RF chip (FBR 14 implementation) delivers forward (FW) and reverse (RW) waves measurements in form of complex values like:

$$FW\_I + i*FW\_Q,$$

and $$RW\_I + i*RW\_Q.$$

In this example, the impedance measurements comprise complex values for forward and reverse wave measurements. The processing circuit 16 is configured to determine a first gamma value based on a relation between the values of forward and reverse wave measurements of a first impedance measurement 511, cf. FIG. 5, of the at least two impedance measurements. The first gamma value can be calculated like $$\text{Gamma}\_1 = (RW\_1\_I + i*RW\_1\_Q)/(FW\_1\_I + i*FW\_1\_Q).$$

In examples the processing circuit 16 may be configured to apply at least on element of the group of an estimated crosstalk correction, an estimated phase correction and an estimated magnitude correction to the first gamma value to obtain a corrected first gamma value. For example, the correction is done in 2 steps:

First step, X-Talk compensation:

Gamma_1=Gamma_1−X-Talk, which can be done in orthogonal coordinates, cf. FIG. 5. In a second step gamma may be transferred into polar coordinates (Gamma_1= Gamma_1_magnitude*exp(−jGamma_1_phase)), Gamma_1_phase=Gamma_1_phase+phase_correction.

Gamma_1_magnitiude=Gamma_1_magnitude*gain_correction.

The new Gamma_1 value is transferred back into orthogonal coordinates and results in an impedance 512 after correction. Generally, in examples, the processing circuit 16 may be configured to apply at least one transformation, from a Cartesian representation to a polar representation or vice versa, when correcting the first gamma value. The processing circuit 16 is configured to determine a first load impedance value 513 based on the corrected first gamma value 512 and a first antenna tuner configuration of the at least two antenna tuner configurations. Using the corrected impedance value and S-matrix data (first antenna tuner configuration) of the antenna tuner 106 a load impedance 513 for the antenna 104 can be calculated:

G_1_Load=(S11−Gamma_1)/(S11*S22−Gamma_1*S22−S12*S21), wherein, S11, S22, S12, S21 are parameters of the antenna tuner's 106 S-matrix. Gamma_1 512 is the gamma value of the measured impedance after correction. Gamma_1_Load 513 is also indicated in FIG. 5.

Using the found load impedance Gamma_1_Load it is possible to calculate what should have been the ideally measured impedance 514 when using the second antenna tuner configuration:

S11_new=S11+(S12*S21*Gamma_1_Load)/(1−S22*Gamma_1_Load).

The processing circuit 16 is configured to determine a first expected impedance 514, S11_new, based on the load impedance value 513 and a second antenna tuner configuration of the at least two antenna tuner configurations. The found S11_new value can then be compared with the second measured impedance after its correction. The processing circuit 16 is configured to determine a first difference, D1, between the first expected impedance 514 and a corrected second gamma value 522 of the at least two impedance measurements. The corrected second gamma value 522 is based on a second impedance measurement 521, which is then corrected based on the same correction values as the first impedance measurement 511 as described above.

In the example depicted in FIG. 5 calculations are repeated in reverse direction using the second impedance measurement or second measured impedance value and the first antenna tuner configuration. The processing circuit 16 is configured to determine a second gamma value based on a relation between the values of forward and reverse wave measurements of the second impedance measurement, Gamma_2=(RW_2_I+i*RW_2_Q)/(FW_2_I+i*FW_2_Q), and apply the estimated crosstalk correction, the estimated phase correction and the estimated magnitude correction to the second gamma value to obtain the corrected second gamma value 522, analogously to what is described above.

The processing circuit 16 is further configured to, compare also FIG. 5, determine a second load impedance value 523 based on the corrected second gamma value 522 and the second antenna tuner configuration, determine a second expected impedance 524 based on the second load impedance value 523 and the first antenna tuner configuration, and determine a second difference D2 between the second expected impedance 524 and the corrected first gamma value 512.

The processing circuit 16 is further configured to determine a third difference, "Correction Error 3" in FIG. 5, between the first and second load impedance values 513, 523. Finally, three errors or differences are found: two between measured and calculated impedances, 512-524, 514-522, and an additional one between two load values, 513, 523. The differences or errors are based on the assumption that the antenna impedance is constant during measurements and also calculated load values should be the same when correction is right.

The three found differences (errors) might be used individually or added to one common Error value in examples. In examples, the above steps may be repeated using different correction values. Per set of correction values a set of differences or errors can be determined, for example, a set of three differences per set of correction values. For example, correction values for which minimum error or differences between calculated and measured values may be chosen for all coming impedance measurements for as long as the TX frequency is constant.

In an example, the first, second and third differences (D1, D2, "Correction Error 3" in FIG. 5) are a first set of differences. The processing circuit 16 is configured to determine a second set of differences based on another estimated crosstalk correction, and/or another estimated phase correction and/or another estimated magnitude correction. The processing circuit 16 may be configured to determine the calibration values based on a minimum difference between measured and expected impedance values.

Such minimum may be a result of a limited search over a limited set of correction values. Hence, the "minimum" might not be an absolute minimum but rather a local minimum or a minimum obtained within the sets of correction values. In some examples, a smart selection of the correction values may be carried out, e.g. based on correlation values determined in the past, at neighbor frequency carriers, based on any other parameter the correction values are correlated to, etc. The processing circuit 16 may be configured to carry out an iteration over different estimated crosstalk, phase, and/or magnitude corrections using a gradient search. Other strategies may as well be used to find adequate corrections values. For example, best, good or adequate correction values different calculation methods could be used, some of which are sweeps over the four corrections values, full search over all possible correction value combinations, four dimensional gradient search, combinations of sweeps and gradient searches, etc.

Figure 6:
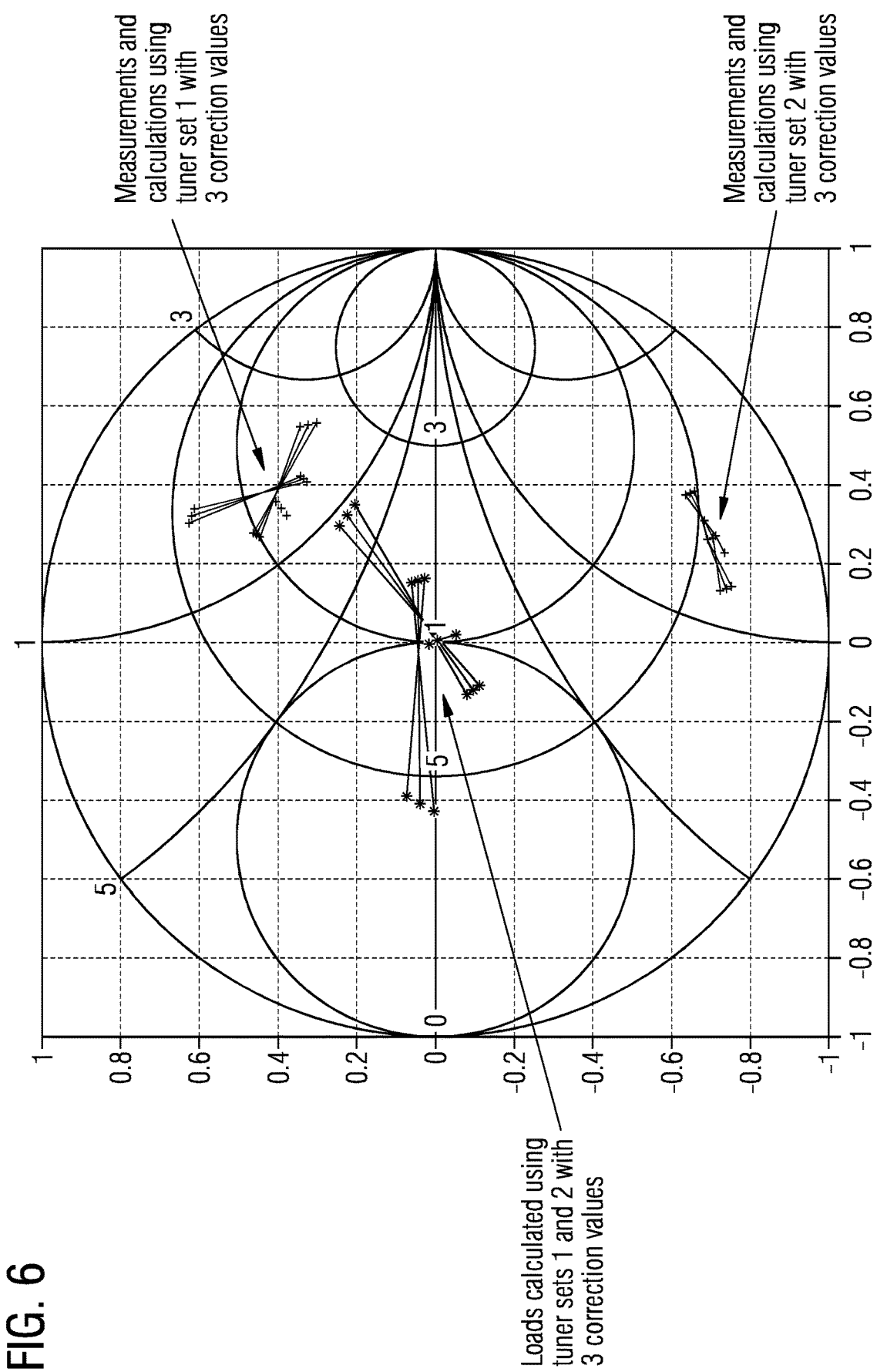
FIG. 6 depicts a Smith chart with a calculation example.

FIG. 6 depicts a Smith chart with a calculation example. FIG. 6 illustrates an example of the above described algorithm carried out for three different sets of correction values and two different antenna tuner configurations. In the Smith chart of FIG. 6 measurements carried out using the first antenna tuner configuration (tuner set 1) are indicated at the top right, loads calculated using the antenna tuner configurations in the center, and measurements and calculations using the second antenna tuner configuration are indicated at the bottom right of the Smith chart. For each combination of measurement, antenna tuner configuration and correction value set a set of differences can be determined, e.g. for three subsequent measurements for the same antenna tuner configuration as indicated in FIG. 6. In some examples a single difference may be considered per combination, as the differences converge in a similar manner to zero when the correction values approach their optimum.

In FIG. 6 it can be seen that one correction set gives the lowest errors compared to the other two. Moreover, examples are not limited to the number of measured points used for calculations. More points may be used to achieve a better accuracy, but may increase calculation time and also the probability that antenna impedance changes. In general, the longer measurement periods the higher a probability that the load has changed. Assuming one impedance measurement to be done in one 3GPP ($3^{rd}$ Generation Partnership Project) frame of 10 ms, then up to 10 measurements over 90 ms could be used. Most probably a user might not change mobile phone's position relative to his/her hands, fingers or head during 0.1 s.

Figure 7A:
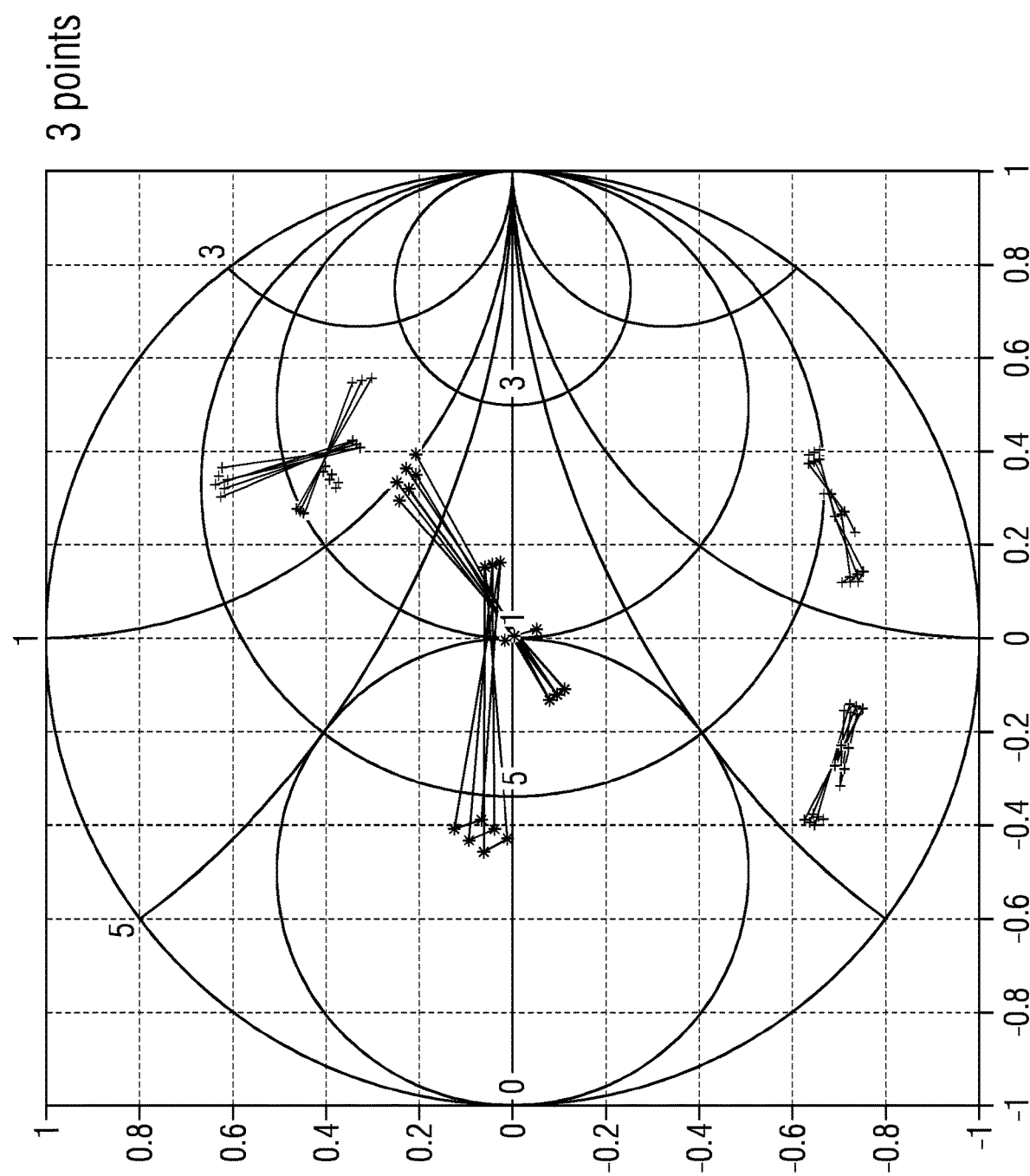
FIG. 7A illustrates an example with three measurement points.
Figure 7B:
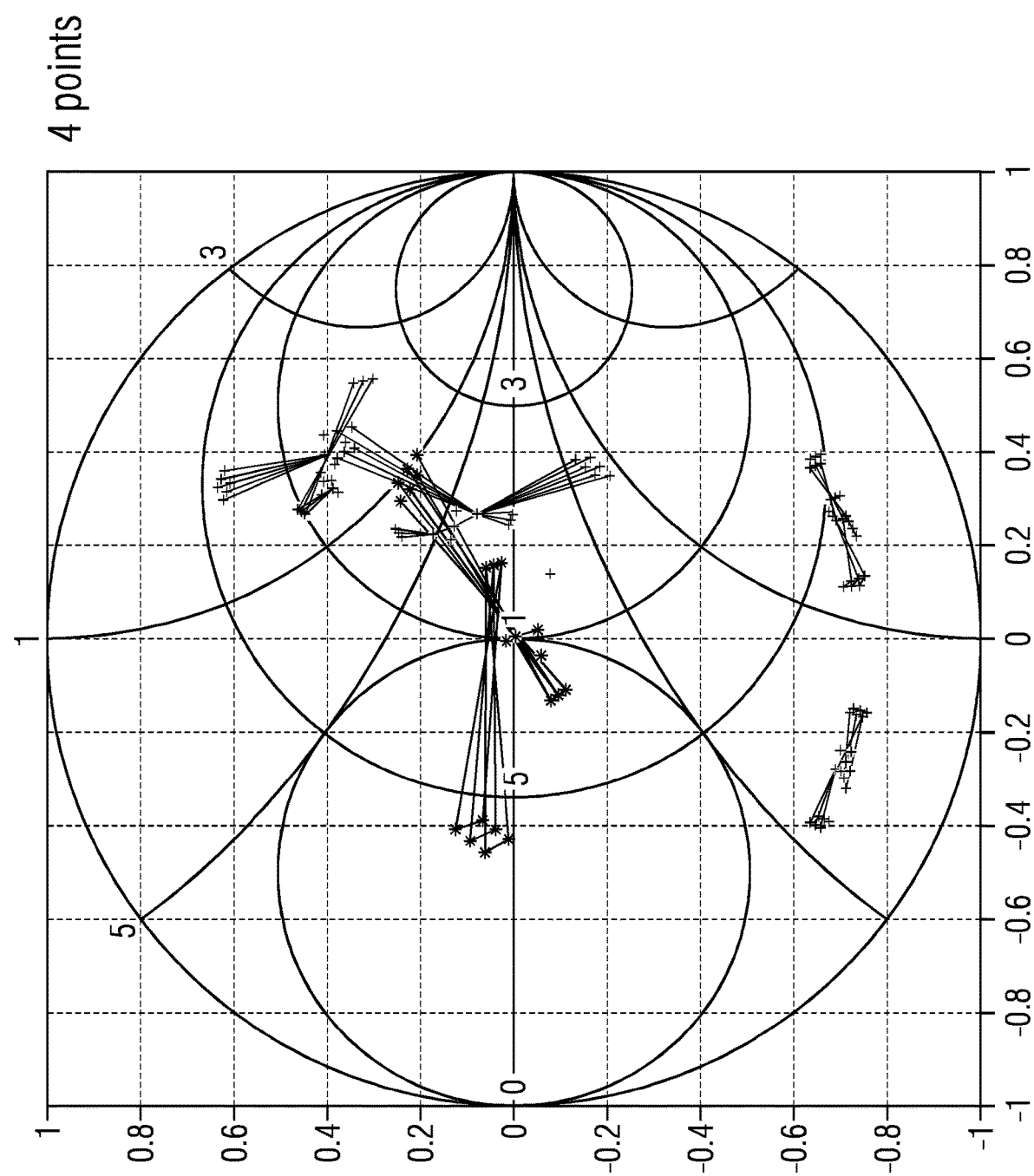
FIG. 7B illustrates an example with four measurement points.

Calculations with three and four measurement points (3 or 4 different antenna tuner configuration) are shown in FIG. 7A and FIG. 7B respectively. FIGS. 7A and 7B illustrate two examples with three and four measurement points in line with the illustration of FIG. 6. FIG. 7A illustrates an example based on three measurement points, and FIG. 7B illustrates an example based on four measurement points. As can be seen from FIGS. 7A and 7B, the more measurement points are available, the more accurate the results may be. However, the longer the measurements take, the higher will be the load differences between first and last measurements. So depending on the scenario a number of measurement points may be selected.

In some examples an initial calibration value determination according to the above may be carried out, for example, when a mobile phone gets switched on in a new mobile communication system after the owner leaves an airplane. A re-calibration may be carried out later on. For the re-calibration a favorable time may be selected, e.g. when implemented in a radio frequency circuit 100 of a mobile phone, for example at night when static RF conditions can be expected.

Factory calibration during manufacturing of a radio circuit may use calibration for impedance measurements over all supported frequency bands and store the results occupying a lot of memory, where in practice only few bands may be used and only one or two frequency carriers in each of them. Up to 99% of calibration values may never be used. Online calibration of at least some examples may reduce factory calibration time and costs and can be repeated from time to time in a tracking mode to compensate temperature drifts and other long time parasitic effects. In some examples online calibration is done inside an application CPU because it may be faster and may support floating operations. By "cold" starting some estimates of correction values can be used and in 0.1 s, at least in some embodiments, new optimum values may be found. When calibration for one frequency is done then the values may be used as initial estimations for neighbor channels or frequencies.

As shown in FIG. 1, examples also provide a radio frequency circuit 100 comprising an antenna 104 and an antenna tuner 106 coupled to the antenna 104. The RF circuit 100 further comprises a transmit unit 102 coupled to the antenna 104 through the antenna tuner 106. The RF circuit 100 further comprises an example of a control circuit 10 as described herein. In some examples the RF circuit 100 may be configured to determine the calibration values during operation of the radio frequency circuit 100 if the radio frequency circuit 100 is operated at a frequency carrier for the first time or for re-calibration. Online calibration or on-the-fly calibration may reduce calibration efforts, as calibration may be carried out at frequency carriers needed, rather than at any potentially supported frequency band.

Other examples are a radio transceiver comprising the radio frequency circuit apparatus or circuit 10 according to the above, and a mobile terminal 200 comprising the radio transceiver. FIG. 8 shows examples of a mobile terminal 200, a base station transceiver 300 and a mobile communication system 400. FIG. 8 shows a network scenario of an example. The network scenario comprises a mobile terminal 200 and base station transceiver 300 in a mobile communication system 400. According to another example, a mobile terminal 200 is provided comprising an example a radio frequency circuit 100a according to the present description. Another example is a base station transceiver 300 comprising an example 100b of the radio frequency circuit of the present description. Yet another example is a mobile communication system 400 comprising at least one of an example of a mobile terminal 200 and an example of a base station transceiver 300.

The mobile communication system 400 may correspond, for example, to one of the Third Generation Partnership Project (3GPP)-standardized mobile communication networks, where the term mobile communication system is used synonymously to mobile communication network. The mobile or wireless communication system may correspond to a mobile communication system of the 5th Generation (5G) and may use mm-Wave technology. The mobile communication system may correspond to or comprise, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN), or mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

A base station or base station transceiver 300 may be operable or configured to communicate with one or more active mobile transceivers 200. A base station transceiver 300 can be located in or adjacent to a coverage area of another base station transceiver, e.g. a macro cell base station transceiver or small cell base station transceiver. Hence, examples may provide a mobile communication system 400 comprising one or more mobile transceivers 200 and one or more base station transceivers 300, wherein the base station transceivers 300 may establish macro cells or small cells, as e.g. pico-, metro-, or femto cells. A mobile transceiver or terminal may correspond to a smartphone, a cell phone, User Equipment (UE), a laptop, a notebook, a personal computer, a Personal Digital Assistant (PDA), a Universal Serial Bus (USB)-stick, a car, etc. A mobile transceiver may also be referred to as UE or mobile in line with the 3GPP terminology.

A base station transceiver 300 can be located in the fixed or stationary part of the network or system 400. A base station transceiver 300 may correspond to a remote radio head, a transmission point, an access point, a macro cell, a small cell, a micro cell, a femto cell, a metro cell etc. A base station transceiver 300 can be a wireless interface of a wired network, which enables transmission of radio signals to a UE or mobile transceiver. Such a radio signal may comply with radio signals as, for example, standardized by 3GPP or, generally, in line with one or more of the above listed systems. Thus, a base station transceiver may correspond to a NodeB, an eNodeB, a Base Transceiver Station (BTS), an access point, a remote radio head, a transmission point etc., which may be further subdivided in a remote unit and a central unit.

FIG. 9 depicts a block diagram of an example of a method for determining calibration values. The method for determining calibration values for a radio frequency apparatus 100 with means 102 for transmitting coupled to an antenna 104 through means 106 for antenna tuning. The method comprising determining the calibration values for the radio frequency apparatus 100 based on at least two impedance measurements and based on at least two antenna tuner configurations.

Figure 10:
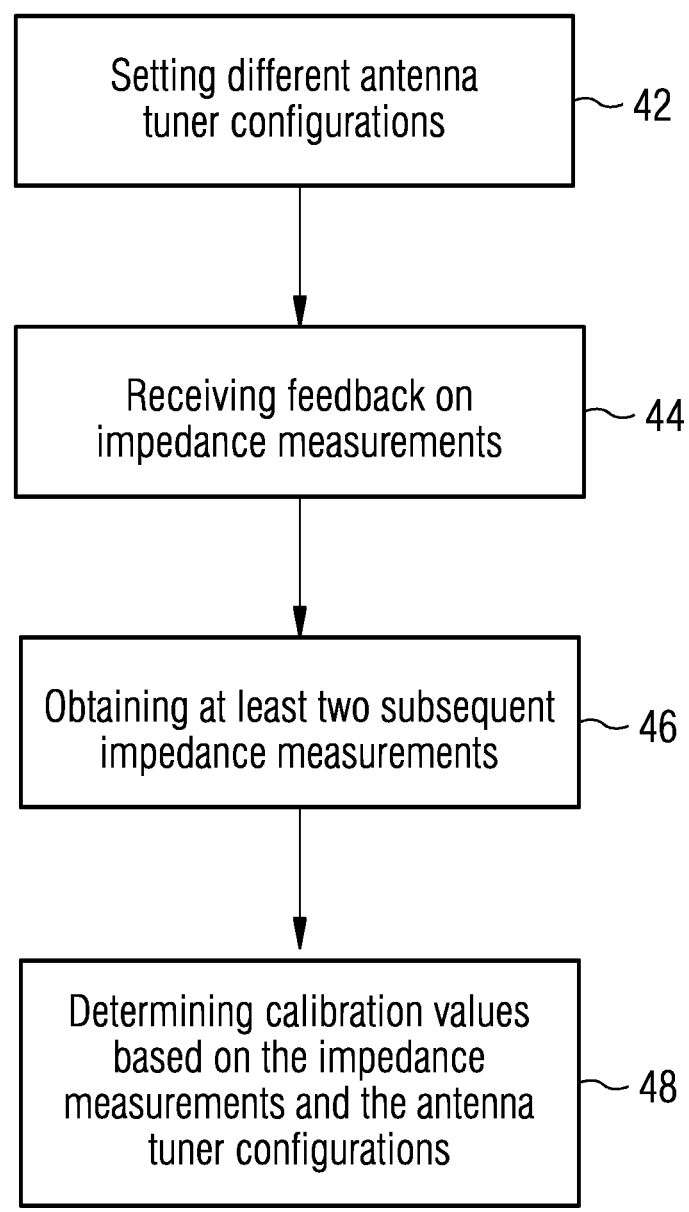
FIG. 10 depicts a block diagram of another example of a method for determining calibration values.

FIG. 10 depicts a block diagram of another example of a method for determining calibration values. The method comprises setting 42 different antenna tuner configurations at the means 106 for antenna tuning, and receiving 44 feedback on impedance measurements between the means 102 for transmitting and the antenna 104. The method further comprises obtaining 46 at least two subsequent impedance measurements based on the at least two different antenna tuner configurations, and determining 48 the calibration values based on the impedance measurements and the antenna tuner configurations.

Another example is a computer program having a program code for performing at least one of the methods described herein, when the computer program is executed on a computer, a processor, or a programmable hardware component. Another example is a machine readable storage including machine readable instructions, when executed, to implement a method or realize an apparatus as described herein. A further example is a machine readable medium including code, when executed, to cause a machine to perform any of the methods described herein.

The examples as described herein may be summarized as follows:

Example 1 is a control circuit 10 configured to determine calibration values for a radio frequency circuit 100 with a transmit unit 102 coupled to an antenna 104 through an antenna tuner 106, the control circuit 10 being configured to determine the calibration values for the radio frequency circuit 100 based on at least two impedance measurements and based on at least two antenna tuner configurations.

Example 2 is the control circuit 10 of example 1, comprising an interface 12 configured to set different antenna tuner configurations at the antenna tuner 106;
a feedback receiver 14 configured to carry out impedance measurements between the transmit unit 102 and the antenna 104; and
a processing circuit 16 coupled to the interface 12 and the feedback receiver 14,
the processing circuit 16 being configured to
obtain the at least two subsequent impedance measurements using the feed-back receiver 14 based on the at least two different antenna tuner configurations, and
determine the calibration values based on the impedance measurements and the antenna tuner configurations.

Example 3 is the control circuit 10 of example 2, wherein the calibration values comprise at least one element of the group of a correction value for a crosstalk of a coupler of the feedback receiver, a correction value for phases of the impedance measurements and a correction value for magnitudes of the impedance measurements.

Example 4 is the control circuit 10 of one of the examples 2 or 3, wherein the antenna tuner configurations are based on known frequency dependent S-matrices of the antenna tuner 106.

Example 5 is the control circuit 10 of one of the examples 2 to 4, wherein the impedance measurements comprise complex values for forward and reverse wave measurements.

Example 6 is the control circuit 10 of example 5, wherein the processing circuit 16 is configured to determine a first gamma value based on a relation between the values of forward and reverse wave measurements of a first impedance measurement of the at least two impedance measurements.

Example 7 is the control circuit 10 of example 6, wherein the processing circuit 16 is configured to apply at least on element of the group of an estimated crosstalk correction, an estimated phase correction and an estimated magnitude correction to the first gamma value to obtain a corrected first gamma value.

Example 8 is the control circuit 10 of example 7, wherein the processing circuit 16 is configured to apply at least one transformation, from a Cartesian representation to a polar representation or vice versa, when correcting the first gamma value.

Example 9 is the control circuit 10 of one of the examples 7 or 8, wherein the processing circuit 16 is configured to determine a first load impedance value based on the corrected first gamma value and a first antenna tuner configuration of the at least two antenna tuner configurations.

Example 10 is the control circuit 10 of example 9, wherein the processing circuit 16 is configured to determine a first expected impedance based on the load impedance value and a second antenna tuner configuration of the at least two antenna tuner configurations.

Example 11 is the control circuit 10 of example 10, wherein the processing circuit 16 is configured to determine a first difference between the first expected impedance and a corrected second gamma value of the at least two impedance measurements.

Example is the control circuit 10 of example 11, wherein the processing circuit 16 is configured to
determine a second gamma value based on a relation between the values of forward and reverse wave measurements of the second impedance measurement,
apply the estimated crosstalk correction, the estimated phase correction and the estimated magnitude correction to the second gamma value to obtain the corrected second gamma value,
determine a second load impedance value based on the corrected second gamma value and the second antenna tuner configuration,
determine a second expected impedance based on the second load impedance value and the first antenna tuner configuration, and
determine a second difference between the second expected impedance and the corrected first gamma value.

Example 13 is the control circuit 10 of example 12, wherein the processing circuit 16 is configured to determine a third difference between the first and second load impedance values.

Example 14 is the control circuit 10 of example 13, wherein the first, second and third differences are a first set of differences and wherein the processing circuit 16 is configured to determine a second set of differences based on another estimated crosstalk correction, and/or another estimated phase correction and/or another estimated magnitude correction.

Example 15 is the control circuit 10 of example 14, wherein the processing circuit 16 is configured to determine the calibration values based on a minimum difference between measured and expected impedance values.

Example 16 is the control circuit 10 of example 15, wherein the processing circuit 16 is configured to carry out an iteration over different estimated crosstalk, phase, and/or magnitude corrections using a gradient search.

Example 17 is a radio frequency circuit 100 comprising an antenna 104;
an antenna tuner 106 coupled to the antenna 104;
a transmit unit 102 coupled to the antenna 104 through the antenna tuner 106; and
a control circuit 10 according to one of the preceding examples.

Example 18 is the radio frequency circuit 100 of example 17, being configured to determine the calibration values during operation of the radio frequency circuit 100 if the radio frequency circuit 100 is operated at a frequency carrier for the first time or for re-calibration.

Example 19 is a transceiver comprising the radio frequency circuit 100 of one of the examples 17 or 18.

Example 20 is a mobile terminal 200 comprising the transceiver of example 19.

Example 21 is a control apparatus 10 configured to determine calibration values for a radio frequency apparatus 100 with means 102 for transmitting coupled to an antenna 104 through means 106 for antenna tuning, the control apparatus 10 being configured to determine the calibration values for the radio frequency apparatus 100 based on at least two impedance measurements and based on at least two antenna tuner configurations.

Example 22 is the control apparatus 10 of example 21, comprising
means 12 for setting different antenna tuner configurations at the means 106 for antenna tuning;
means 14 for receiving feedback being configured to carry out impedance measurements between the means 102 for transmitting and the antenna 104; and
means 16 for processing coupled to the means 12 for setting and the means 14 for receiving, the means 16 for processing being configured to
    obtain at least two subsequent impedance measurements using the means 14 for receiving based on at least two different antenna tuner configurations, and
determine the calibration values based on the impedance measurements and the antenna tuner configurations.

Example 23 is the control apparatus 10 of example 22, wherein the calibration values comprise at least one element of the group of a correction value for a crosstalk of a coupler of the feedback receiver, a correction value for phases of the impedance measurements and a correction value for magnitudes of the impedance measurements.

Example 24 is the control apparatus 10 of one of the examples 22 or 23, wherein the antenna tuner configurations are based on known frequency dependent S-matrices of the antenna tuner 106.

Example 25 is the control apparatus 10 of one of the examples 22 to 24, wherein the impedance measurements comprise complex values for forward and reverse wave measurements.

Example 26 is the control apparatus 10 of example 25, wherein the means 16 for processing is configured to determine a first gamma value based on a relation between the values of forward and reverse wave measurements of a first impedance measurement of the at least two impedance measurements.

Example 27 is the control apparatus 10 of example 26, wherein the means 16 for processing is configured to apply at least on element of the group of an estimated crosstalk correction, an estimated phase correction and an estimated magnitude correction to the first gamma value to obtain a corrected first gamma value.

Example 28 is the control apparatus 10 of example 27, wherein the means 16 for processing is configured to apply at least one transformation, from a Cartesian representation to a polar representation or vice versa, when correcting the first gamma value.

Example 29 is the control apparatus 10 of one of the examples 27 or 28, wherein the means 16 for processing is configured to determine a first load impedance value based on the corrected first gamma value and a first antenna tuner configuration of the at least two antenna tuner configurations.

Example 30 is the control apparatus 10 of example 29, wherein the means 16 for processing is configured to determine a first expected impedance based on the load impedance value and a second antenna tuner configuration of the at least two antenna tuner configurations.

Example 31 is the control apparatus 10 of example 30, wherein the means 16 for processing is configured to determine a first difference between the first expected impedance and a corrected second gamma value of the at least two impedance measurements.

Example 32 is the control apparatus 10 of example 31, wherein the means 16 for processing is configured to
determine a second gamma value based on a relation between the values of forward and reverse wave measurements of the second impedance measurement,
apply the estimated crosstalk correction, the estimated phase correction and the estimated magnitude correction to the second gamma value to obtain the corrected second gamma value,
determine a second load impedance value based on the corrected second gamma value and the second antenna tuner configuration,
determine a second expected impedance based on the second load impedance value and the first antenna tuner configuration, and
determine a second difference between the second expected impedance and the corrected first gamma value.

Example 33 is the control apparatus 10 of example 32, wherein the means 16 for processing is configured to determine a third difference between the first and second load impedance values.

Example 34 is the control apparatus 10 of example 33, wherein the first, second and third differences are a first set of differences and wherein the means 16 for processing is configured to determine a second set of differences based on another estimated crosstalk correction, and/or another estimated phase correction and/or another estimated magnitude correction.

Example 35 is the control apparatus 10 of example 34, wherein the means 16 for processing is configured to determine the calibration values based on a minimum difference between measured and expected impedance values.

Example 36 is the control apparatus 10 of example 35, wherein the means 16 for processing is configured to carry out an iteration over different estimated crosstalk, phase, and/or magnitude corrections using for example a gradient search.

Example 37 is a radio frequency apparatus 100 comprising
an antenna 104;
means 106 for antenna tuning coupled to the antenna 104;
means 104 for transmitting coupled to the antenna 104 through the means 106 for antenna tuning; and
a control apparatus 10 according to one of the examples 21 to 36.

Example 38 is the radio frequency apparatus 100 of example 37, being configured to determine the calibration values during operation of the radio frequency apparatus 100 if the radio frequency apparatus 100 is operated at a frequency carrier for the first time or for re-calibration.

Example 39 is a transceiver comprising the radio frequency apparatus 100 of one of the example 37 or 38.

Example 40 is a mobile terminal 200 comprising the transceiver of example 39.

Example 41 is a method for determining calibration values for a radio frequency apparatus 100 with means 102 for transmitting coupled to an antenna 104 through means 106 for antenna tuning, the method comprising
determining the calibration values for the radio frequency apparatus 100 based on at least two impedance measurements and based on at least two antenna tuner configurations.

Example 42 is the method of example 41, comprising
setting 42 different antenna tuner configurations at the means 106 for antenna tuning;
receiving 44 feedback on impedance measurements between the means 102 for transmitting and the antenna 104; and
obtaining 46 at least two subsequent impedance measurements based on the at least two different antenna tuner configurations, and
determining 48 the calibration values based on the impedance measurements and the antenna tuner configurations.

Example 43 is the method of example 42, wherein the calibration values comprise at least one element of the group of a correction value for a crosstalk of a coupler of the feedback receiver, a correction value for phases of the impedance measurements and a correction value for magnitudes of the impedance measurements.

Example 44 is the method of one of the examples 42 or 43, wherein the antenna tuner configurations are based on known frequency dependent S-matrices of the antenna tuner 106.

Example 45 is the method of one of the examples 42 to 44, wherein the impedance measurements comprise complex values for forward and reverse wave measurements.

Example 46 is the method of example 45, further comprising determining a first gamma value based on a relation between the values of forward and reverse wave measurements of a first impedance measurement of the at least two impedance measurements.

Example 47 is the method of example 46, further comprising applying at least on element of the group of an estimated crosstalk correction, an estimated phase correction and an estimated magnitude correction to the first gamma value to obtain a corrected first gamma value.

Example 48 is the method of example 47, further comprising applying at least one transformation, from a Cartesian representation to a polar representation or vice versa, when correcting the first gamma value.

Example 49 is the method of one of the examples 47 or 48, further comprising determining a first load impedance value based on the corrected first gamma value and a first antenna tuner configuration of the at least two antenna tuner configurations.

Example 50 is the method of example 49, further comprising determining a first expected impedance based on the load impedance value and a second antenna tuner configuration of the at least two antenna tuner configurations.

Example 51 is the method of example 50, further comprising determining a first difference between the first expected impedance and a corrected second gamma value of the at least two impedance measurements.

Example 52 is the method of example 51, further comprising
determining a second gamma value based on a relation between the values of forward and reverse wave measurements of the second impedance measurement,
applying the estimated crosstalk correction, the estimated phase correction and the estimated magnitude correction to the second gamma value to obtain the corrected second gamma value,
determining a second load impedance value based on the corrected second gamma value and the second antenna tuner configuration,
determining a second expected impedance based on the second load impedance value and the first antenna tuner configuration, and
determining a second difference between the second expected impedance and the corrected first gamma value.

Example 53 is the method of example 52, further comprising determining a third difference between the first and second load impedance values.

Example 54 is the method of example 53, wherein the first, second and third differences are a first set of differences and further comprising determining a second set of differences based on another estimated crosstalk correction, and/or another estimated phase correction and/or another estimated magnitude correction.

Example 55 is the method of example 54, further comprising determining the calibration values based on a minimum difference between measured and expected impedance values.

Example 56 is the method of example 55, further comprising carrying out an iteration over different estimated crosstalk, phase, and/or magnitude corrections using for example a gradient search.

Example 57 is a method for a radio frequency apparatus 100 comprising an antenna 104, means 106 for antenna tuning coupled to the antenna 104, and means 104 for transmitting coupled to the antenna 104 through the means 106 for antenna tuning, the method comprising a method according to one of the examples 41 to 56.

Example 58 is the method of example 57, further comprising determining the calibration values during operation of the radio frequency apparatus 100 if the radio frequency apparatus 100 is operated at a frequency carrier for the first time or for re-calibration.

Example 59 is a method for a radio transceiver comprising the method of one of the example 57 or 58.

Example 60 is a method for a mobile terminal 200 comprising the method of example 59.

Example 61 is a computer program having a program code for performing the method of at least one of the examples 41 to 60, when the computer program is executed on a computer, a processor, or a programmable hardware component.

Example 62 is a machine readable storage including machine readable instructions, when executed, to implement a method or realize an apparatus as described herein.

Example 63 is a machine readable medium including code, when executed, to cause a machine to perform the method of any one of examples 41 to 60.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A control circuit configured to:
    determine calibration values for a radio frequency circuit with a transmit unit coupled to an antenna through an antenna tuner, the determination based on:
        a plurality of impedance measurements, and
        a plurality of antenna tuner configurations;
    the control circuit comprising:
        an interface configured to set different antenna tuner configurations at the antenna tuner;
        a feedback receiver configured to carry out impedance measurements between the transmit unit and the antenna; and
        a processing circuit coupled to the interface and the feedback receiver, the processing circuit being configured to:
            use the feedback receiver to obtain:
                a first impedance measurement based on a first antenna tuner configuration; and
                a second impedance measurement based on a second antenna tuner configuration, determine a first gamma value and a second gamma value based on the-first impedance measurement and the second impedance measurement, respectively, apply at least one element of the group of an estimated crosstalk correction, an estimated phase correction and an estimated magnitude correction to the first gamma value and the second gamma value to obtain a corrected first gamma value and a corrected second gamma value, respectively, determine a first load impedance value based on the corrected first gamma value and the first antenna tuner configuration;

determine a first expected impedance based on the first load impedance value and the second antenna tuner configuration;

determine a first difference between the first expected impedance and the corrected second gamma value; and determine the calibration values based on the first difference.

2. The control circuit of claim 1, wherein the calibration values comprise at least one element of the group of a correction value for a crosstalk of a coupler of the feedback receiver, a correction value for phases of the impedance measurements and a correction value for magnitudes of the impedance measurements.

3. The control circuit of claim 1, wherein the antenna tuner configurations are based on known frequency dependent S-matrices of the antenna tuner.

4. The control circuit of claim 1, wherein the impedance measurements comprise complex values for forward and reverse wave measurements.

5. The control circuit of claim 1, wherein the processing circuit is configured to apply at least one transformation, from a Cartesian representation to a polar representation or vice versa, when correcting the first gamma value and the second gamma value.

6. The control circuit of claim 1, wherein the processing circuit is configured to:

determine a second load impedance value based on the corrected second gamma value and the second antenna tuner configuration, determine a second expected impedance based on the second load impedance value and the first antenna tuner configuration, determine a second difference between the second expected impedance and the corrected first gamma value, and determine the calibration values based on the second difference.

7. The control circuit of claim 6, wherein the processing circuit is configured to determine:

a third difference between the first load impedance value and the second load impedance value, and determine the calibration values based on the third difference.

8. The control circuit of claim 7, wherein the first, second, and third differences are a first set of differences and wherein the processing circuit is configured to determine a second set of differences based on another estimated crosstalk correction, and/or another estimated phase correction and/or another estimated magnitude correction.

9. The control circuit of claim 8, wherein the processing circuit is configured to determine the calibration values based on a minimum difference between measured and expected impedance values.

10. The control circuit of claim 9, wherein the processing circuit is configured to carry out an iteration over different estimated crosstalk, phase, and/or magnitude corrections using a gradient search.

11. A radio frequency circuit comprising:
an antenna;
an antenna tuner coupled to the antenna;
a transmit unit coupled to the antenna through the antenna tuner; and
a control circuit configured to determine calibration values for a radio frequency circuit with a transmit unit coupled to an antenna through an antenna tuner, the determination based on:
a plurality of impedance measurements, and
a plurality of antenna tuner configurations;
the control circuit comprising:
an interface configured to set different antenna tuner configurations at the antenna tuner;
a feedback receiver configured to carry out impedance measurements between the transmit unit and the antenna; and
a processing circuit coupled to the interface and the feedback receiver, the processing circuit being configured to:
use the feedback receiver to obtain:
a first impedance measurement based on a first antenna tuner configuration; and
a second impedance measurement based on a second antenna tuner configuration,
determine a first gamma value and a second gamma value based on the-first impedance measurement and the second impedance measurement, respectively,
apply at least one element of the group of an estimated crosstalk correction, an estimated phase correction and an estimated magnitude correction to the first gamma value and the second gamma value to obtain a corrected first gamma value and a corrected second gamma value, respectively,
determine a first load impedance value based on the corrected first gamma value and the first antenna tuner configuration;
determine a first expected impedance based on the first load impedance value and the second antenna tuner configuration;
determine a first difference between the first expected impedance and the corrected second gamma value; and
determine the calibration values based on the first difference.

12. The radio frequency circuit of claim 11, being configured to determine the calibration values during operation of the radio frequency circuit if the radio frequency circuit is operated at a frequency carrier for the first time or for re-calibration.

13. A transceiver comprising the radio frequency circuit of claim 11.

14. A mobile terminal comprising the transceiver of claim 13.

15. A method for determining calibration values for a radio frequency apparatus with means for transmitting coupled to an antenna through means for antenna tuning, the method comprising:

obtaining a first impedance measurement based on a first antenna tuner configuration and a second impedance measurement based on a second antenna tuner configuration, determining a first gamma value and a second gamma value based on the-first impedance measurement and the second impedance measurement, respectively, applying at least one element of the group of an estimated crosstalk correction, an estimated phase correction and an estimated magnitude correction to the first gamma value and the second gamma value to obtain a corrected first gamma value and a corrected second gamma value, respectively, determining a first load impedance value based on the corrected first gamma value and the first antenna tuner configuration;

determining a first expected impedance based on the first load impedance value and the second antenna tuner configuration;

determining a first difference between the first expected impedance and the corrected second gamma value; and determining the calibration values based on the first difference.

16. The method of claim 15, wherein the calibration values comprise at least one element of the group of a correction value for a crosstalk of a coupler of the feedback receiver, a correction value for phases of the impedance measurements and a correction value for magnitudes of the impedance measurements.

17. The method of claim 15, wherein the antenna tuner configurations are based on known frequency dependent S-matrices of the antenna tuner.

18. A non-transitory machine readable medium including code, when executed, to cause a machine to perform the method of claim 15.

* * * * *